(12) United States Patent
Vierimaa et al.

(10) Patent No.: US 11,659,418 B2
(45) Date of Patent: May 23, 2023

(54) RADIO EQUIPMENT TEST DEVICE

(71) Applicant: Siemens Industry Software Inc., Plano, TX (US)

(72) Inventors: Kari Vierimaa, Kempele (FI); Harri Valasma, Oulu (FI)

(73) Assignee: Siemens Industry Software Inc., Plano, TX (US)

( * ) Notice: Subject to any disclaimer, the term of this patent is extended or adjusted under 35 U.S.C. 154(b) by 26 days.

(21) Appl. No.: 17/429,139

(22) PCT Filed: Feb. 19, 2019

(86) PCT No.: PCT/US2019/018546
§ 371 (c)(1),
(2) Date: Aug. 6, 2021

(87) PCT Pub. No.: WO2020/171800
PCT Pub. Date: Aug. 27, 2020

(65) Prior Publication Data
US 2022/0078643 A1    Mar. 10, 2022

(51) Int. Cl.
*H04W 24/06* (2009.01)
*H04B 17/15* (2015.01)
*H04B 17/29* (2015.01)

(52) U.S. Cl.
CPC ............ *H04W 24/06* (2013.01); *H04B 17/15* (2015.01); *H04B 17/29* (2015.01)

(58) Field of Classification Search
CPC .................................................... H04W 24/06
See application file for complete search history.

(56) References Cited

U.S. PATENT DOCUMENTS

| 7,730,367 | B2 | 6/2010 | Parthasarathy |
| 9,658,340 | B2 | 5/2017 | Shin et al. |
| 9,660,739 | B2 | 5/2017 | Reed |
| 9,671,445 | B2 | 6/2017 | Huynh et al. |
| 9,692,530 | B2 | 6/2017 | O'keeffe et al. |

(Continued)

FOREIGN PATENT DOCUMENTS

| CN | 101543110 A | 9/2009 |
| CN | 105934796 A | 9/2016 |

(Continued)

OTHER PUBLICATIONS

International Preliminary Report on Patentability for International Patent Application PCT/US2019/018546 dated May 4, 2021.

(Continued)

*Primary Examiner* — Hsinchun Liao
(74) *Attorney, Agent, or Firm* — Lempia Summerfield Katz LLC

(57) ABSTRACT

A single radio equipment test device includes a control unit for testing a plurality of antennas, (e.g., an antenna array). The control unit includes a first interface to operatively couple the control unit to an antenna under test, (e.g., arranged in a test chamber). The control unit further includes a second interface to operatively couple the control unit to a reference antenna, (e.g., also arranged in the test chamber). The control unit is configured to control and/or monitor the antenna under test and the reference antenna.

6 Claims, 11 Drawing Sheets

(56) References Cited

U.S. PATENT DOCUMENTS

| | | | |
|---|---|---|---|
| 2006/0149958 A1* | 7/2006 | Omathuna | G06F 9/445 713/2 |
| 2006/0215744 A1 | 9/2006 | Oneill | |
| 2007/0024308 A1* | 2/2007 | Azimi | G01R 31/3004 324/750.3 |
| 2007/0096758 A1 | 5/2007 | Kolman | |
| 2009/0153158 A1* | 6/2009 | Dunn | G01R 31/2822 324/762.01 |
| 2009/0219217 A1 | 9/2009 | Kitada et al. | |
| 2010/0049465 A1 | 2/2010 | Pineda et al. | |
| 2010/0075664 A1 | 3/2010 | Maucksch | |
| 2013/0021048 A1 | 1/2013 | Peng et al. | |
| 2013/0141287 A1 | 6/2013 | Pallonen | |
| 2014/0154997 A1* | 6/2014 | Chen | H04B 3/46 455/67.14 |
| 2015/0213849 A1 | 7/2015 | Srinivas et al. | |
| 2015/0270912 A1 | 9/2015 | Dhayni et al. | |
| 2016/0077905 A1 | 3/2016 | Menon et al. | |
| 2016/0174094 A1 | 6/2016 | Waheed et al. | |
| 2017/0223559 A1 | 8/2017 | Kong et al. | |
| 2019/0004102 A1 | 1/2019 | Gienger | |

FOREIGN PATENT DOCUMENTS

| | | |
|---|---|---|
| CN | 106575249 A | 4/2017 |
| CN | 106712779 A | 5/2017 |
| EP | 3199958 A1 | 8/2017 |
| JP | 2018198416 A | 12/2018 |
| WO | 2017097107 A1 | 6/2017 |

OTHER PUBLICATIONS

PCT International Search Report and Written Opinion of International Searching Authority dated Oct. 23, 2019 corresponding to PCT International Application No. PCT/US2019/018546.

Sumitomo Electric et al: "TP for TR 37.842: Indoor Anechoic Chamber EIRP testing procedure"; 3GPP Draft; R4-163751; 3rd Generation Partnership Project (3GPP); Mobile Competence Centre; vol. RAN WG4, May 23, 2016-May 27, 2016; XP051106707; retrieved: URL:http://www.3gpp.org/ftp/Meetings_3GPP_SYNC/RAN4/Docs/; May 22, 2016.

Agilent Technologies, "Bluetooth Measurement Fundamentals." pp. 1-40. Oct. 12, 2006.

* cited by examiner

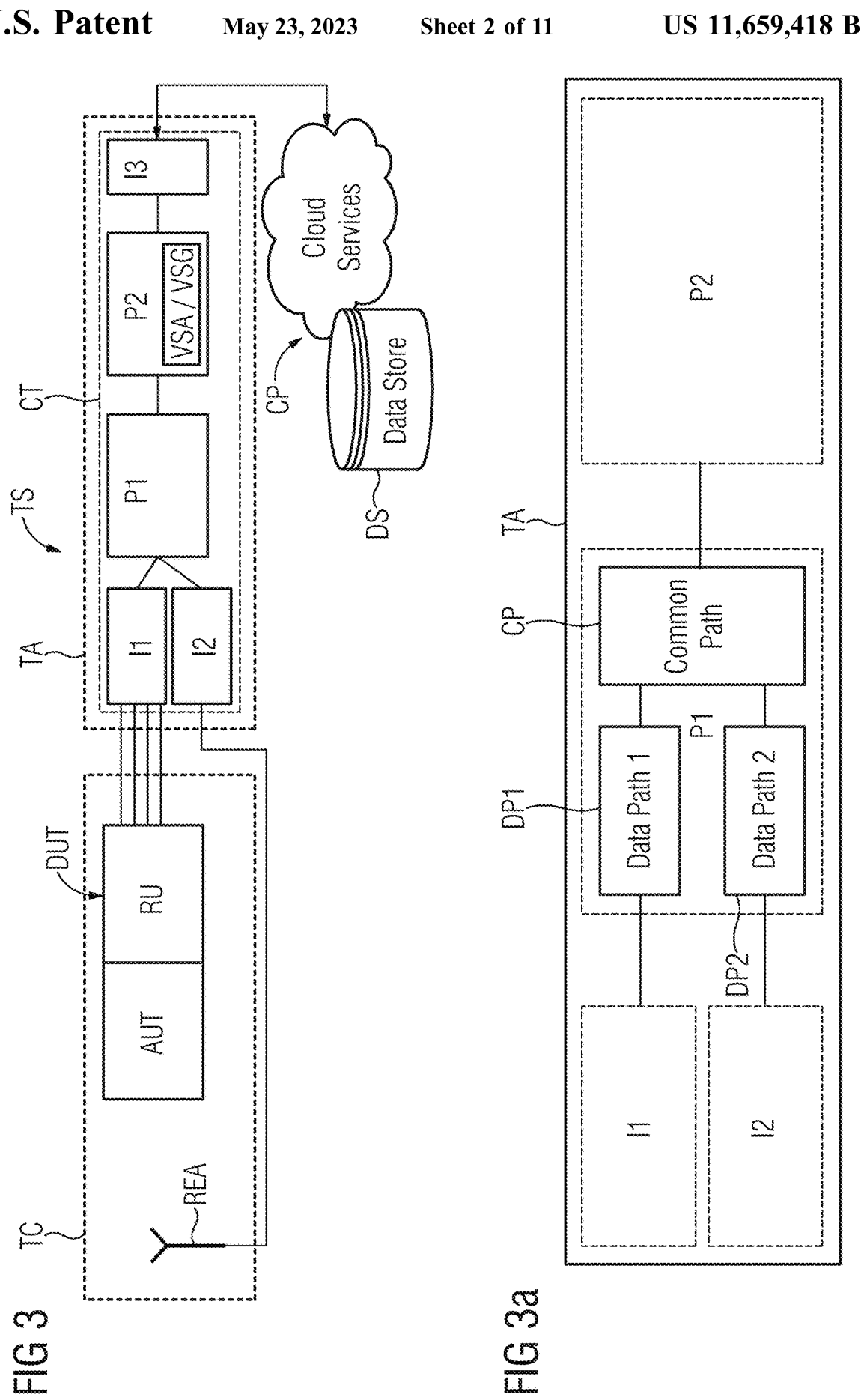

RADIO EQUIPMENT TEST DEVICE

The present patent document is a § 371 nationalization of PCT Application Serial No. PCT/US2019/018546, filed Feb. 19, 2019, designating the United States, which is hereby incorporated by reference.

TECHNOLOGICAL FIELD

The disclosure relates to the field of radio communication systems, and more specifically to testing of radio equipment.

BACKGROUND

SIEMENS and its subsidiaries are developing innovative test systems for verification and validation. Such test systems may include one or more test devices that may be utilized in a variety of high tech fields, ranging from cellular base stations to the automotive industry. For example, a radio equipment test system or test device, e.g. from the X-STEP product line, allows stimulation and tracing of all the digital interfaces in a modern radio equipment such as a radio equipment control (REC) and/or radio equipment (RE) modules (also known as baseband unit, BBU, and remote radio head, RRH, respectively). The digital interface protocols supported by such a test device may include JESD204B, CPRI, OBSAI RP3, or another Ethernet-based protocol, e.g., 10G, 25G, 100 or 400G Ethernet. A test device may further include in register-transfer level (RTL) simulation and hardware emulation and may also work with FPGA prototyping, real-time post-silicon board debugging, and final product testing. The test device may cover every phase in a radio base station product development cycle, ranging all the way from very first RTL simulations to post-production.

In general, radio frequency (RF) communication systems and devices, like other electronics, require testing and, in some cases, calibration. Testing and calibration may present challenges in the case of an RF communication system or device which supports multiple transmission (Tx) and reception (Rx) channels.

SUMMARY

The scope of the present disclosure is defined solely by the appended claims and is not affected to any degree by the statements within this summary. The present embodiments may obviate one or more of the drawbacks or limitations in the related art.

In particular, the fifth generation of cellular mobile communications, 5G, requires, due to the smaller cell sizes, a large amount of antenna arrays, in particular to enable beam-forming. Therefore, the testing of antennas and antenna arrays will become a challenge.

According to a first aspect, a single radio equipment test device is proposed. The single radio equipment test device includes a control unit for testing a plurality of antennas, e.g., an antenna array. The control unit further includes a first interface to operatively couple the control unit to an antenna under test, (e.g., arranged in a test chamber). The control unit includes a second interface to operatively couple the control unit to a reference antenna, (e.g., also arranged in the test chamber). The control unit of the test device serves for controlling and/or monitoring the antenna under test and the reference antenna.

According to a second aspect, a radio equipment test system includes a radio equipment test device according to the first aspect and a test chamber in which the reference antenna and the antenna under test are arranged and, e.g., connected to a cloud platform is proposed.

According to a third aspect, a method of testing radio equipment by way of a single radio equipment test device is proposed. The method includes controlling and/or monitoring an antenna under test, (e.g., arranged in a test chamber), via a first interface of a control unit of the radio equipment test device. The method further includes controlling and/or monitoring a reference antenna, (e.g., also arranged in the test chamber), via a second interface of the control unit of the radio equipment test device.

Thus, a test device for testing radio equipment is proposed that possesses one or more digital interfaces. Thereby, simplifying the testing of radio equipment. In addition, the amount of cables is reduced by the proposed setup and test device, respectively. Furthermore, the proposed test device and test system, respectively, enable testing of radio equipment such as massive antennas, e.g., a large amount of antennas at the same time. According to the proposed aspects, testing only a limited number of antennas is possible as well. Another advantage is that the test vectors, e.g., the radio signals used for testing, (e.g. the radio signals as generated by the radio equipment test device), are reproducible. For example, it is assured that identical test signals are used when testing the same radio equipment at different times or different radio equipment. This is because the transmission and/or reception times of the test signals are known to the single radio equipment test device and/or the test vectors are exactly the same because the same single radio equipment test device is used for generating and receiving test signals. When running one or more test vectors through a radio equipment under test, the timing for transmission (by the radio equipment under test, in particular an antenna under test) and reception (by reference antenna), or vice versa, of test vectors is known. This may be leveraged, e.g., in order to determine transmission delay of the radio equipment under test, in particular the antenna under test. Furthermore, a recording of received RF signals and/or transmitted test vectors may be made. This is particularly advantageous for debugging antennas in different environments as the same recorded test sequence may be used. The recording may be replayed and/or analyzed without the test chamber being present or needed. For example, as will be described by way of the embodiments, a measurement probe may be used for recording a test vector and/or the radio signals received, e.g., in the form of IQ data. The recording of the test vector and/or the received RF signal may be replayed at a later point in time. As will be apparent in the following description, instead of the measurement probe, other measures may be employed for recording received RF signals and/or one or more test vectors.

BRIEF DESCRIPTION OF THE DRAWINGS

Embodiments will now be described in more detail in relation to the enclosed drawings:

FIG. 3 depicts another illustration of a radio equipment test system.

FIG. 3a depicts another illustration of a radio equipment test system.

DETAILED DESCRIPTION

A radio base station test system allows stimulation and tracing of the digital interfaces in all fronts of a modern radio base station, in Radio Equipment Control (REC) and Radio Equipment (RE) modules, also known as Baseband Unit (BU) and Remote Radio Head (RRH). Digital interface protocols between the REC and RE include CPRI, OBSAI RP3, and 10G Ethernet. Furthermore, 10 GbE and similar variants, such as CPRI over Optical Transport Network, are used in the REC—core network boundary. JESD204 is a standard that is widely used between AD/DA converters (in antenna interfaces) and logic devices (RE/RRH).

Figure 1:
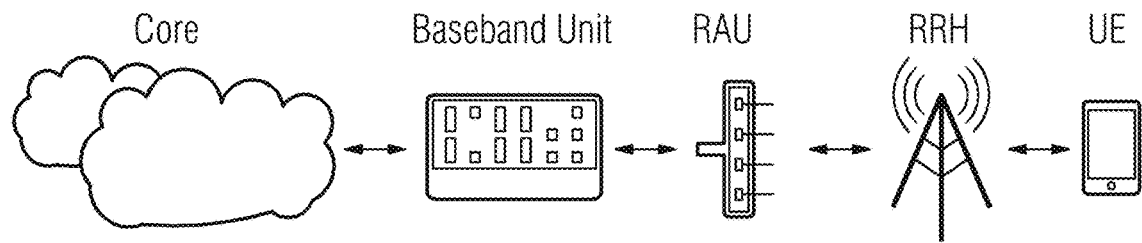
FIG. 1 depicts an illustration of a mobile communication network.

In FIG. 1, an exemplary radio communication system is illustrated. The traditional monolithic base transceiver station (BTS) architecture is increasingly being replaced by a distributed BTS architecture in which the functions of the BTS are separated into two physically separate units—a baseband unit (BBU) and a remote radio head (RRH). The BBU performs baseband processing for the particular air interface that is being used to wirelessly communicate over one or more radio frequency channels. The RRH performs radio frequency processing to convert baseband data output from the BBU to radio frequency signals for radiating from one or more antennas coupled to the RRH and/or to produce baseband data for the BBU from radio frequency signals that are received at the RRH via one or more antennas. The RRH may be installed near the one or more antennas, (e.g., at the top of a tower), and the BBU may be installed in a more accessible location, (e.g., at the bottom of the tower). However, as the case may be, RRH and BBU may be collocated, (e.g., in a lab). The BBU and the RRH may be connected through one or more fiber optic links. The interface between the BBU and the RRH is defined by fronthaul communication link standards such as the Common Public Radio Interface (CPRI) family of specifications, the Open Base Station Architecture Initiative (OBSAI) family of specifications, and the Open Radio Interface (ORI) family of specifications.

In the 5G architecture, a new frequency domain fronthaul interface will be specified. The frequency domain fronthaul is a functional split where the IFFT/FFT (Inverse Fast Fourier Transform/Fast Fourier Transform) may be moved from the BBU to the RRH. Frequency domain samples instead of time domain samples are sent over the fronthaul. The RRH will have information through a communication channel about the resource allocation for different UEs. The new eCPRI interface specification "eCPRI Specification V1.0 (Aug. 22, 2017)" is already available.

For the deployment scenario where the remote radio head, RRH, (sometimes also denoted as Radio Remote Unit, RRU, or simply Radio Unit, RU) and the baseband unit, BBU, (sometimes also denoted as radio equipment controller, REC, or nowadays distributed unit, DU) are separated, the signals received from one or more antennas have to be transported over the media that is connecting the RRH with the BBU as normally the signal combination is done at the BBU. The interface that is used for the connection between the BBU and the RRH may be called the fronthaul. The signals over the fronthaul may be complex time domain samples such as specified in the legacy Common Public Radio Interface, CPRI. Digitized waveforms may be transported over the fronthaul from the BBU to the RRH, and vice versa, via one or more radio aggregation units (RAU). In order to test one or more radio equipment, the digitized waveforms may be in the form of so called test vectors, which in turn may be in the form of IQ data.

RAU is an entity introduced by different 5G standard drafts and its function is to connect multiple radios to a BBU and to serve as a time and latency critical data processing unit for the RRHs. The functionality of the RAU is further defined by the functional split chosen between BBU and RRH.

The user equipment's, UE, signals are power limited and as the path loss varies with the distance to the UE a large dynamic range is encountered when those signals are represented digitally, it may be assumed that for the complex frequency sample a large number of bits will be required and in the case of MIMO (Multiple Input Multiple Output)/diversity layers the required fronthaul capacity will multiply with the number of antennas. Furthermore, it is desired to model such propagation of radio signals in order to test the functionality of the radio system and its components. As the capacity on the fronthaul is limited it is desired to find methods that optimize the usage of the fronthaul.

The BBU may be connected to a core network, denoted as "Core" in FIG. 1, and possibly to other BBUs (not shown) via one or more backhaul or crosshaul connections, respectively. BBUs increasingly rely on commercial server chips as C-RAN topology is getting deployed. BBUs need to be able to control the evolving fronthaul networks by supporting different types of fronthaul topologies, equipment, protocols, and line rates. The complexity of this process makes BBU testing, and radio equipment testing in general, challenging and time consuming.

By way of an active antenna, the radio and the antenna part may be integrated into one compact, powerful unit. These antennas need to be controlled by the Baseband Unit (BBU), and the exchange of information requires common messages. The content of the messages needs to be understood similarly by the manufacturers of both BBU and active antenna. A radio equipment test device, such as X-STEP, may also support different protocols and interfaces, such as the JESD204B interface, allowing antenna manufacturers to test the antenna interface in a digital way. This way, interoperability may be configured and tested separately in early stages of device development. Active antennas are gaining ground as 4G technology keeps of evolving and the launch of 5G technology is approaching.

Figure 2:
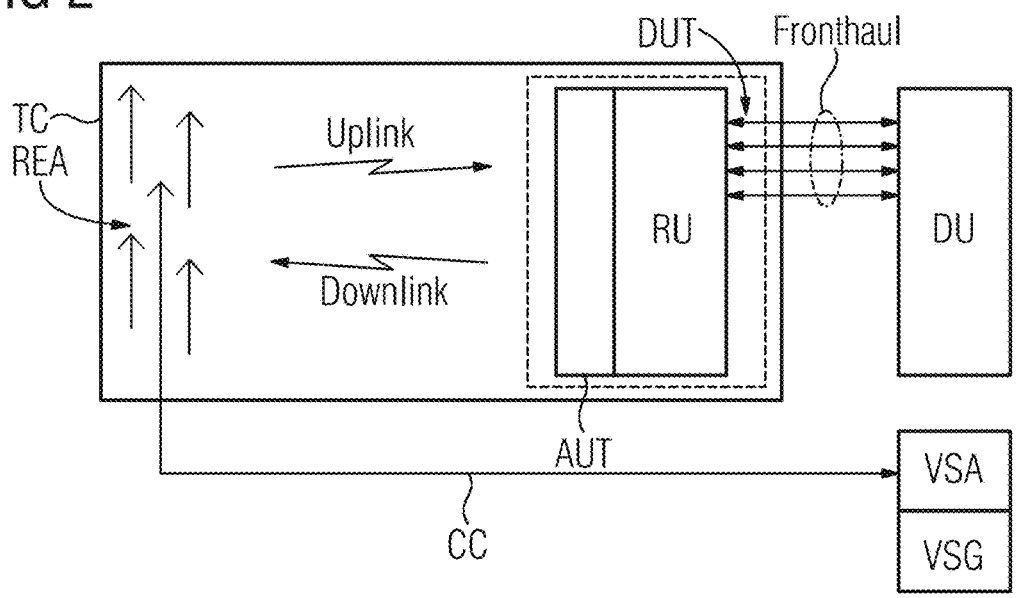
FIG. 2 depicts an illustration of a radio equipment test system.

Now turning to the radio equipment test system as shown in FIG. 2, in a test setup, a radio equipment, (e.g., a device under test (DUT) (inside the dotted line in FIG. 2)), is connected via one or more fronthaul protocols (e.g., CPRI, eCPRI, OBSAI, RoE, etc.) to a radio equipment test device that serves for providing digital data, in particular test data or test signals, (e.g., in the form of IQ data), e.g., serves as a distributed-unit (DU). In 5G radio network a base station is denoted as gNodeB or gNB. This gNB may include a central unit and one or more distributed units, DUs. This logical node includes a subset of the gNB functions, depending on the functional split option. Its operation is controlled by the central unit, CU, not shown. Evolving from 4G/LTE to 5G New Radio (NR) transport architecture, the main change is that the original BBU function in 4G/LTE is split into three parts: Central Unit (CU), Distributed Unit (DU), and Radio Unit (RU).

The central unit, not shown, is a logical node that may include gNB's functions like transfer of user data, mobility control, radio access network sharing, positioning, session management etc., except those functions are allocated exclusively to the DU. The central unit controls the operation of one or more DUs over one or more fronthaul interfaces, not shown. A central unit is also known as BBU/REC/RCC/C-RAN/V-RAN. Even though in the following, mainly the terms RU, DU, and 5G terminology are used those terms are meant to incorporate the corresponding function, units, modules, or device in corresponding radio technologies such as 2G, 3G, and 4G or even other radio technologies, such as Wi-Fi.

Now, the DU may be connected to an RU, which for example includes an (e.g., active) antenna unit. Thus, it is possible to connect a DU to either one or more antennas, in particular one or more antenna units (AU) or even one or more active antenna units (AAU), dependent on the functional split selected between DU and RU. In order to test the one or more antennas of the antenna under test AUT, a reference antennas REA including one or more antennas is arranged in the test chamber TC together with the antenna unit. It should be understood that as mentioned in the above the DU may be replaced by a radio equipment test device, or test device in short.

In 2/3/4G, the number of antennas (of an antenna unit, e.g. of the antenna under test AUT or a reference antenna REA) is limited, and it is possible to use coaxial cables CC to perform direct RF measurement devices by way of a vector-signal-analyzer, VSA, and/or a vector-signal-generator, VSG. The VSG may generate baseband IQ data vectors for modulated signals. VSA on the other hand analyzes baseband IQ data vectors of modulated signals. Hence, VSA and/or VSG may be used to check a DUT's transmitting and/or receiving performance/functionality as shown in FIG. 2. The reference antenna REA may be coupled to a vector—signal-analyzer, VSA. Corresponding devices are commercially available, for example under www.keysight.com/find/spectrumanalyzers. On the other hand, the antenna under test AUT may be coupled to a radio equipment test device via which test data, e.g., IQ data, may be transmitted to and/or received from the antenna under test AUT. In the embodiment of FIG. 2, the DU serves as the radio equipment test device for transmitting and/or receiving, e.g. IQ data, via fronthaul communication link.

With the demand for high user throughput in limited radio spectrum, a Massive MIMO active antenna unit is the solution to use a large number of built-in antennas to set up dedicated connections to different users by sharing the same radio spectrum.

The antenna count may be increasing, in particular in 5G and especially when beamforming is in use. Therefore, it is not reasonable to use a direct connection via coaxial cables CC to the individual antennas. Furthermore, the antennas, (e.g., combined to an antenna array), are in the same mechanical case or enclosing together with a radio unit (RU), such a setup, may also be referred to as an active antenna. Nowadays the radio equipment test device for providing test signals, such as IQ data, to the DUT and the measurement device for monitoring/examining/analyzing the test signals transmitted by the DUT, such as a VSA, are separate devices, and there is no central control between those. The RF test chamber, TC, is needed for radiation protection, internal and external. The size of the RF test chamber TC may vary between the size of a suit-case and a big hall. The interior surfaces of the test chamber TC may be covered with radiation absorbent material (RAM) to define a RF anechoic test chamber TC.

Figure 2A:
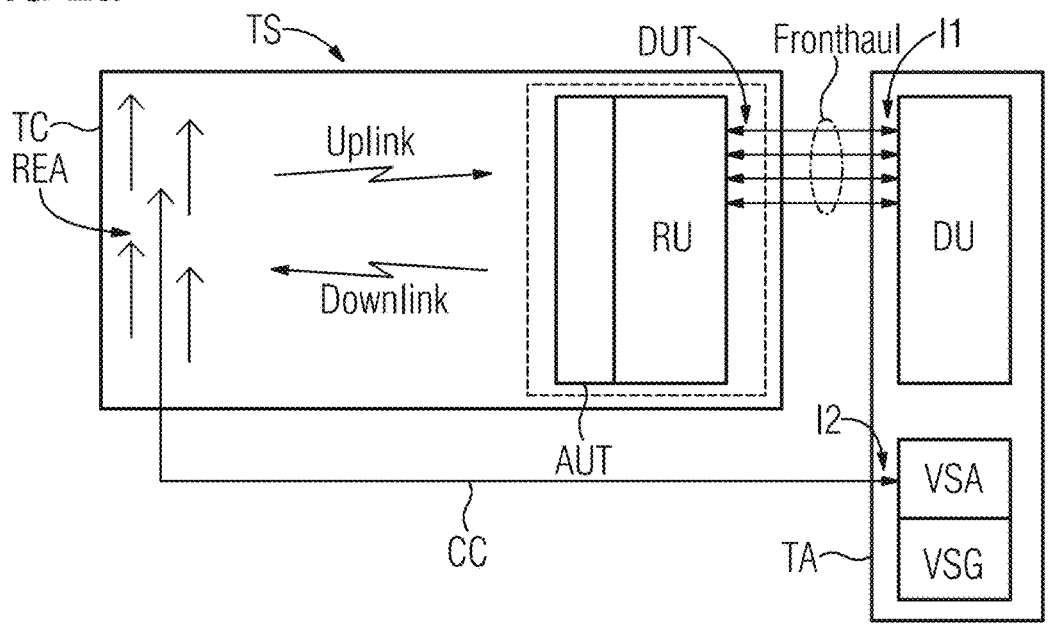
FIG. 2a depicts an illustration of a radio equipment test system.

Now turning to FIG. 2a, as may be seen the DU and the VSA and/or the VSG are combined into a single radio equipment test device, TA. This allows usage of a single device TA with one or more digital interfaces, I1 and/or I2, as the case may be, for testing of radio equipment. Of course, in particular interface I2 for providing the VSA and/or VGA functionality may be an analog interface for receiving analog input from the radio signals received and/or for transmitting radio signals via reference antenna REA, thereby simplifying the testing of radio equipment. For example, as shown in FIG. 2a, the device under test, DUT, may include an RU, e.g., an active antenna unit, or the antenna array, AUT, only. In addition, the amount of cables is reduced by the proposed setup. Furthermore, testing of radio equipment may include testing massive antennas, e.g., a large amount of antennas at the same time. The proposed test device, TA, allows for testing of such a massive-MIMO setup but also allows for testing only a limited number of antennas. Another advantage is that the test vectors, e.g., the radio signals used for testing, e.g., the radio signals as generated by the radio equipment test device, TS, are reproducible, e.g., it is assured that identical test signals are used when testing the same or different radio equipment. This is because the transmission and/or reception times of the test signals are known to the single radio equipment test device, TA, and/or the test vectors are (e.g., exactly) the same because the same single radio equipment test device, TA, is used. Furthermore, the recording of received RF signals and/or transmitted test vectors may be made. This is particularly advantageous to debug antennas in different environments. The recording may be replayed and/or analyzed without the test chamber and/or the DUT being present or needed. For example, as will be described by way of the embodiments in the following, a measurement probe may be used for recording a test vector and/or the radio signals received, e.g., in the form of IQ data. The recording of the test vector and/or the received RF signal may be replayed at a later point in time. As will be apparent in the following description, instead of the measurement probe, other measures may be employed for recording received RF signals and/or one or more test vectors.

Testing may be performed in accordance with certain requirements, such as conformance testing, in particular as described in 3GPP TS 34.114 V12.2.0 (September 2016) or any earlier or even a forthcoming future version of the 3GPP standard. Therein certain test procedures for performance measurements of User Equipment (UE)/Mobile Station (MS) are described. For example, uplink and downlink frequencies to be tested as well as the positioning of the device under test are specified therein.

The embodiment as shown in FIG. 2a and the individual parts may otherwise correspond to the embodiment as described in FIG. 2. One or more functions and/or functionalities of the DU and the VSA/VSG may be implemented by a control unit of the test device, TA. Such a control unit may include one or more processors for executing the functions and/or functionalities. The single radio equipment test device TA may include a single housing, enclosure, or casing in which the one or more processors and, e.g., a storage unit such as a memory, are arranged. The single radio equipment test device, TA, may thus be operatively connected to the device under test DUT and the reference antenna REA at the same time. The device under test, DUT, may either be the radio unit, RU, as a whole, or only part of the radio unit, RU, such as the antenna or antenna array of the radio unit, RU.

Now turning to FIG. 3, an antenna under test AUT may be placed in a test chamber TC together with a reference antenna REA (including one or more antennas) in order to test desired functioning of the antenna under test AUT and/or the RU. Antenna under test AUT and the RU may form an active antenna (unit), AAU, and which is subject to testing, thus may be denoted as device under test, DUT.

As already mentioned, in order to receive the radio signals emitted by the antenna under test AUT, a reference antenna REA, also denoted as measurement antenna, may be placed in the test chamber TC. The reference antenna REA may serve for receiving the radio signals emitted by the antenna under test AUT and/or for amplifying the radio signals received. The reference antenna REA may also serve for transmitting radio signals to the AUT and/or DUT, e.g. when it is connected to a VSG.

According to an aspect of the present disclosure, the one or more functions of a VSA and/or the VGA are now included in the radio equipment test device TA, cf. FIG. 2a, and/or a cloud platform CP to which the radio equipment test device TA may be operatively connected to. In particular, digital signal processing performed by the VSA is now part of the radio equipment test device TA and/or the cloud platform CP. Digital signal processing may include FFT/IFFT of the radio signal received, or more precisely the signal representative of the radio signals transmitted and/or received by the antenna under test. In particular, digital signal processing may include FFT of the radio signal received by the one or more reference antennas. Further functions now part of the radio equipment test device TA may include one or more demodulation algorithms, including for example inter alia (sub-)sampling, (quadrature-) mixing and baseband modulation of the radio signals. The functions just mentioned may be performed by a first processor P1, e.g., an FPGA, of the test device. Instead, another digital signal processor, DSP, may be used in order to carry out one or more of the above mentioned functions. In addition to those functions the first processor P1 may provide the test signals or test data for testing the AUT and/or DUT as explained in connection with FIG. 2.

The antenna under test AUT may be an active antenna, e.g., an antenna that contains electronic components, such as transistors. The same applies to the reference antenna REA, which may be an active antenna too. Now, the antenna under test AUT may be connected to the test device TA via a first interface I1 of the test device TA. The antenna under test AUT may include a corresponding interface, not shown in FIG. 3, to operatively, (e.g., communicatively), couple to the test device TA. Hence, the test device TA may transmit and/or receive data, e.g. I/Q data, relating to the radio signals to be transmitted or received by the antenna under test AUT via the first interface I1. For example, the data relating to the transmitted and/or received radio signals may be transmitted via a digital communication protocol, such as (e)CPRI. The data relating to the radio signals to be transmitted may be converted by the antenna under test AUT into radio signals. Accordingly, the radio signals received by the antenna under test AUT may be converted from the analog to the digital domain.

Now, the first processor P1 may exchange data relating to radio signals, e.g., in the form of IQ data, with the second processor P2. To this end, the first processor P1 of a control unit CT may be communicatively coupled to a second processor P2 of the control unit CT. For example, IQ data may be transmitted from the first processor P1 to the second processor P2 in order to be analyzed by the second processor P2. On the other hand, the second processor P2 may transmit IQ data, generated by the second processor P2, to the first processor. The first processor P1 may further process the IQ data either received from the DUT and/or received from the second processor according to one or more RF channel models. A channel model may characterize of radio signal propagation as a function of frequency, distance, and other conditions. Hence, a radio equipment test device TA is proposed, wherein the control unit operative to provide the functions as described throughout the present disclosure is integrated in the test device TA.

The radio equipment test device TA includes a control unit CT that in turn includes the first processor P1 and the second processor P2. Furthermore, the control unit CT may be operative to receive a result of a determination of an antenna fault from a cloud platform CP. The act of determining an antenna fault may be based on one or more antenna fault characteristics stored in the cloud platform CP. The one or more antenna fault characteristics may arise from fault characteristics of one or more different test devices TA. That is to say, one or more radio equipment test devices TA of the same or of a different type may record one or more antenna fault characteristics and the characteristics may be stored in the cloud platform CP. Thus, the antenna fault characteristics stored in the cloud platform CP may be used in order to determine one or more antenna faults, or the likelihood of the same, for the current antenna under test. To this end, data representative of the one or more antenna fault characteristics may be retrieved, e.g., download, from the cloud platform CP to the radio equipment test device TA, e.g., via the third interface I3 of the test device or the control unit CT, respectively. Alternatively, at least part of the signals representative of the radio signals transmitted and/or received by the antenna under test AUT may be transmitted, e.g. uploaded, to the cloud platform CP. In both cases, the signals representative of the radio signals transmitted and/or received by the antenna under test AUT may be compared to the data representative of the one or more antenna fault characteristics. In yet another embodiment, certain antenna fault characteristics may be determined by way of the control unit CT of the radio equipment test device TA, whereas other antenna fault characteristics may be determined in the remote cloud platform CP. For example, a preliminary check for an antenna fault may be done by the test device TA, whereas another more elaborated or resource intensive check for antenna faults is done via the cloud platform CP, e.g. one or more services of the cloud platform.

Thus, a radio equipment test device TA with a first and second processor P1, P2 operative and/or configured to execute one or more of the above functions is proposed. The test device further includes an interface I1 for receiving and/or transmitting test data, e.g., in form of I/Q data to and/or from a radio equipment under test.

Furthermore, the first processor P1 may process data related to radio signals received and/or to be transmitted by the antenna unit, (e.g., the AUT, the RU, and the DUT), in parallel to data related to radio signals received and/or to be transmitted by the reference antenna REA. For example, different pipelines or data paths may be configured for processing data relating to the radio signals received and/or to be transmitted by the AUT, RU, DUT, and reference antenna REA, as the case may be. A pipeline or data path may include different tasks such as performing a Fourier-transformation, or Fast-Fourier-Transformation as the case may be, on data received, performing a filtering of the transformed data and performing an Inverse-Fourier-transformation, or Inverse-FFT respectively. In addition, the first processor P1 may (in case the signals received or to be transmitted via the reference antenna are in analog form) perform conversion to or from analog to digital domain or digital to analog domain. Corresponding implementation guidelines for the above mentioned tasks may be found in "Parallel Programming for FPGAs, by Ryan Kastner, Janarbek Matai, and Stephen Neuendorffer, May 11, 2018". It should be understood that the first processor P1 may apply one or more (different) channel models to the radio signals received or to be transmitted by the antenna under test AUT and/or the reference antenna REA.

For the purpose of integrating the VSA and/or VSG into the test device TA, the functions of a VSA and/or VSG are implemented by way of the second processor P2. That is to say, the radio signals data pre-processed by the first processor P1 may be analyzed by way of the second processor P2. For example, the radio equipment test device may thus be suitable to determine error vector magnitude, code domain power, and/or spectral flatness of the radio signals transmitted/received by the antenna under test AUT and/or the reference antenna REA. Test signals received and/or to be transmitted by the reference antenna are transmitted via the interface I2 of the control unit CT or more precisely of the first processor P1.

Although the interface I1, I2, I3 in FIG. 3 are shown to be separate from the first and second processor P1, P2, respectively, it should be understood that the interface may be interfaces of the first processor P1 and P2, respectively, may be directly connected, e.g. interfaces I1, I2 are digital interfaces of processor P1 and interface I3 is a digital interface of processor P2. Alternatively, interface I2 may be an analog interface of processor P1.

Hence, it is proposed to have a central control unit CT, e.g., the control unit CT, that provides the functionality of a combined test device and a VSA and/or VSG. This is achieved by the architectures as depicted throughout the figures and the corresponding description. According to an aspect of the present disclosure, the one or more functions of a VSA and/or the VGA are now included in the radio equipment test device TA and/or a cloud platform CP to which the radio equipment test device TA may be operatively connected to.

In FIG. 3a, another exemplary embodiment of a test device TA is illustrated. The components as shown in FIG. 3a may be arranged in a common housing or enclosure. Connections between the interfaces I1, I2 and the first processor P1, (e.g., an FPGA), are parallel and/or independent. Each interface I1, I2 may have an individual connection and individual protocol. For example, the first interface I1 may implement the CPRI protocol and the second interface I2 may implement the JESD204B protocol. Inside the first processor P1, both connections may include individual data paths DP1, DP2. Additionally, as shown in FIG. 3a, the individual data paths DP1, DP2 are connected to a common data path part CP. The common data path part CP may serve for data transmission between the first processor P1 and the second processor P2. The data paths DP1, DP2 may be configured to suit the protocols used, e.g. CPRI, eCPRI, JESD, etc. The common data path part CP may be a memory mapped register or memory space, such as AXI4. The connection to the second processor P2 may thus be implemented by way of memory mapped protocol (PCIe). Via the data paths DP1 and/or DP2, the common data path part, e.g., the respective memory, may be accessed and optionally data may be streamed from/to the memory.

FPGAs may include an array of logic cells that implement small logical operations and are surrounded by peripheral I/O which may be programmed for different signaling standards.

According to an embodiment of the architecture proposed for the test device TA, data processing is partially executed by the FPGA. Mainly, lower physical layer processing like serialization and/or deserialization, line coding, and/or other operation of incoming data, e.g. via interface I1 and/or interface I2 is performed by the FPGA. Thus, processing of the transmission line data received is performed by the FPGA, whereas the actual data processing, e.g., analysis of the content of the data representing radio signals received/transmitted, is performed by the second processor and/or via one or more services of the cloud platform CP. Mainly, all payload data processing is made by processor P2 and/or via one or more services of the cloud platform CP.

For example, VITA 57.4 carrier card may be used to implement the interface I1 and for connecting to the first processor P1, (e.g., an FPGA). Furthermore, VITA 57.1 carrier card may be used to implement the interface I2 and for connecting to first processor P1.

Figure 4:
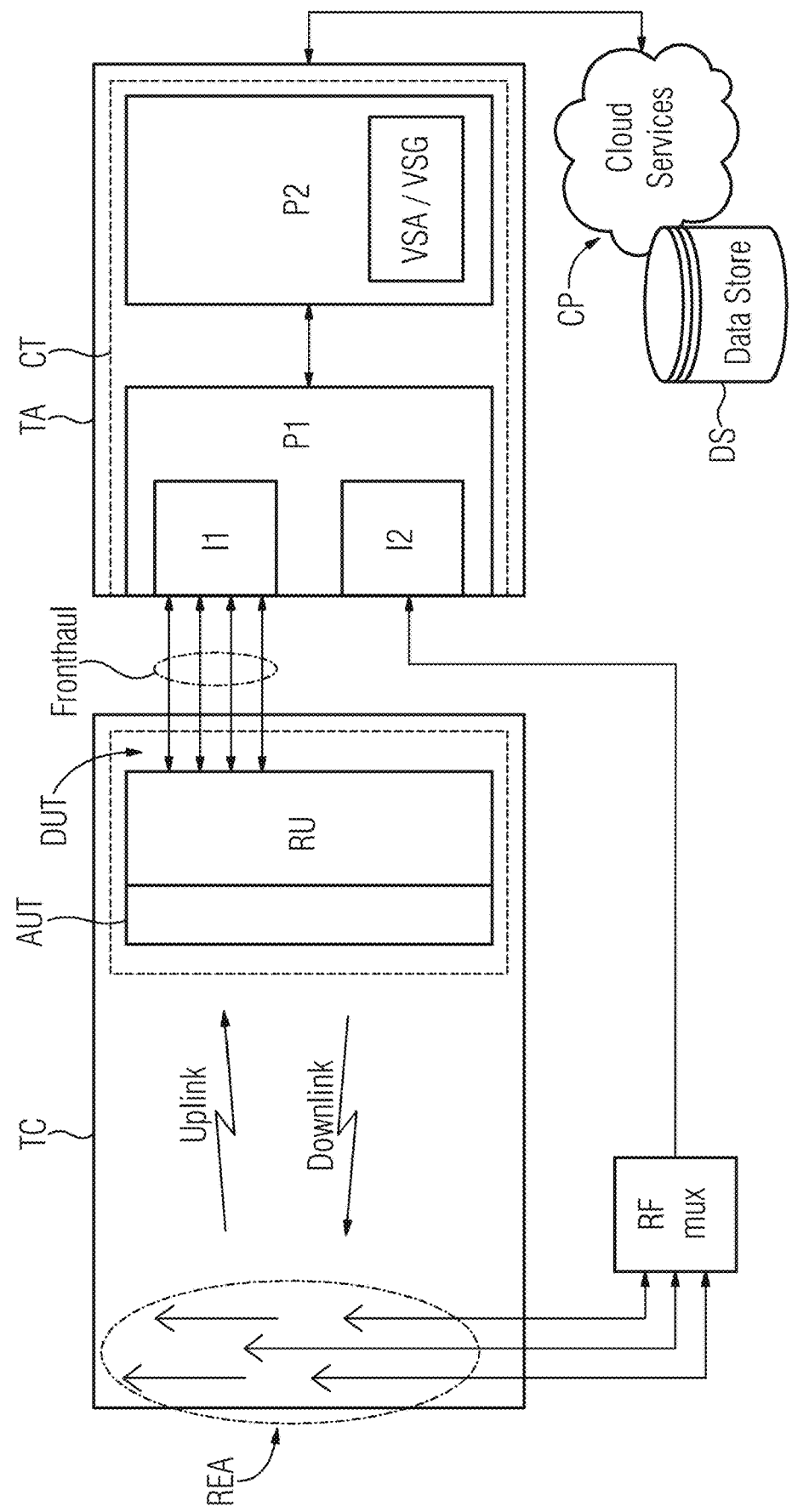
FIG. 4 depicts yet another illustration of a radio equipment test system.

Now turning to FIG. 4, the one or more antennas of a reference antenna REA may be coupled to a multiplexer, MUX. The multiplexer may be external on internal of the test device TA. The multiplexer MUX may be coupled, as depicted in FIG. 4, to an interface I2 of the test device TA. The interface I2 may be a software-defined-radio, e.g., one or more amplifiers and/or analog-to-digital-signal converters. The interface I2 may be part of a digital signal processor, e.g., the first processor p1, (e.g., implemented by way of an FPGA). Hence, the test device TA may include a control unit CT, which includes a first processor P1 coupled to the first and second interface I2. The first processor P1 may be capable of digital signal processing, such as measuring, filtering, and/or compressing signals received from the reference antenna REA via the second interface I2. In addition, the first processor P1 may be capable of processing data according to one or more digital protocols for communication via the first interface with the antenna under test AUT and/or the radio unit RU, as the case may be.

As shown in FIG. 3, the reference antenna REA may include multiple antennas arranged in an antenna array. In order to operatively connect to the individual antennas of the antenna array, the multiplex MUX as described in the above may be used. If multiple antennas are in use, then it is possible to use multiplexer MUX for antenna selection. In such a case, the interface I2 of the first processor P1 may be a software-defined radio implemented by way of the first processor P1, (e.g., an FPGA). Such an interface I2 may handle multiple RF connections. That is to say, a single interface I2 for multiple antennas may be provided to sample the radio signal received directly (instead of applying additional hardware, such as one or more variable-frequency oscillators, mixers and filters).

The advantage with this setup is to get accurate test repeatability. All signals generated and measured, and all digital data captured is controlled by a single test device. The data relevant for further analysis may be linked to one another and stored in cloud platform CP for further analysis. The cloud platform may include one or more services, e.g., cloud services, running on the cloud platform. The cloud platform CP may also possess a data store for storing received data and for retrieving data from the data store. For example, SIEMENS provides a cloud platform including multiple services for data processing called MindSphere. MindSphere is a cloud-based, open IoT operating system for the Industrial Internet of Things.

It should be understood that by way of the term "antenna" one or more antennas may be understood and that an antenna may include one or more antenna arrays, e.g., multiple connected antennas which work together as a single antenna. Furthermore, the antenna, may it be the antenna under test AUT or the reference antenna REA, may be suitable for beam-forming of radio signals, in particular according to the 5G specification of beamforming. Further details regarding the active antennas, passive antennas, antenna arrays, beam-forming and the 5G use-case may be found in the whitepaper "Rohde & Schwarz Antenna Array Testing—Conducted and Over the Air: The Way to 5G", retrievable via http://www.rohde-schwarz.com/appnote/1MA286.

In another embodiment, the test device TA may monitor the antenna under test AUT by way of the reference antenna REA. That is to say, the reference antenna REA may receive the radio signals emitted by the antenna under test AUT. Control and/or monitoring of the antenna under test AUT and the reference antenna REA is integrated in the control unit CT. The control unit includes a first and a second processor P1, P2, wherein the first processor P1 may be an FPGA and the second processor may be a CPU, e.g., a general purpose CPU. The test device TA serves for generating test data, e.g., I/Q data, in particular by the FPGA and the CPU. Herein, the second antenna located in the test chamber is denoted as reference antenna REA but is also known as measurement antenna, throughout the art.

In the embodiments of FIGS. 3 and 4, the first interface may receive digital data as input and the second interface receives an analog signal as input. Alternatively, the second interface P2 is digital interface and receive digital data as input. For example, the second interface P2 is operative and/or configured to receive and transmit data via digital (fronthaul) protocol, such as (e)CPRI.

It is proposed to have a new, single test device architecture, in particular for 5G (massive-MIMO), that manages the reference antennas in a test chamber and the antennas of a device under test (DUT) within that chamber. Thus, a single base band processor (FPGA) and a single processor for controlling the test routine may be used. Previously, two separate devices have been used.

Furthermore, an automated error type recognition is proposed. For example, when testing a massive-MIMO antenna unit, a database is created. The database contains identified (e.g., known) error types and their signature/profile. Now, when testing a device (DUT) a check whether one or more channel profiles match the profiles stored is performed. Thereby, an error type may be automatically identified. The test device may include a connection to a cloud platform. That is now, test routines and the error signatures may be stored and/or accessed by way of a cloud platform. It should be understood that in this embodiment but also in any other embodiments as the case may be the radio equipment under test may be the (active) antenna (unit) or the electronics part of the (active) antenna, e.g. a System-On-a-Chip as shown for example in FIGS. 6 and 8.

Now turning to the cloud platform CP, the cloud platform CP may include a data storage associated with the cloud platform. For example, a user may want to store a certain behavior of an antenna under test as an antenna fault characteristic in the cloud platform. The user may record the behavior of the antenna subject to certain test conditions by way of the test device and transmit this data as a certain antenna fault characteristic in the cloud platform CP.

In addition, a user may want to store one or more additional antenna fault characteristics in the radio equipment test device itself. For this purpose, the user may update the one or more antenna fault characteristics stored locally in the radio equipment test device. This may be done by sending a request, e.g., for synchronization of one or more antenna fault characteristics, to a user account in the cloud platform. Transmission and/or reception of the antenna fault characteristics to and/or from the cloud platform CP may occur via the third interface I3. Connection to the cloud platform CP may be established through the internet.

Figure 5:
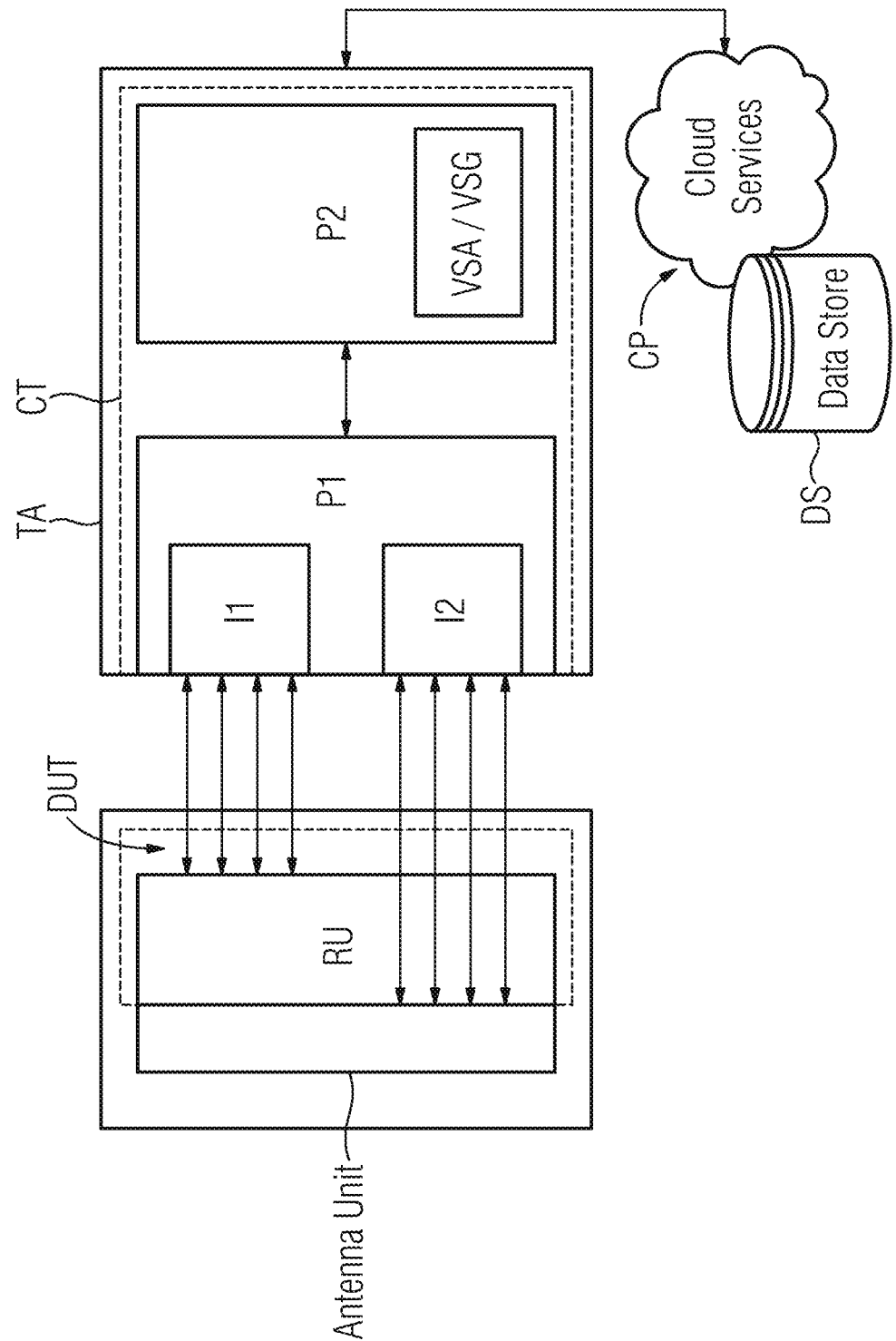
FIG. 5 depicts yet another illustration of a radio equipment test system.

Now turning to FIG. 5, testing of the RU of the DUT is shown in more detail. In this embodiment, only the digital (data processing) part of RU is under test. The RU may include a System-On-a-Chip, SoC. An exemplary implementation of a RU, also denoted as RRH, using a SoC is shown in "Remote Radio Heads and the evolution towards 4G networks, by Christian F. Lanzani, Georgios Kardaras, Deepak Boppana", retrievable from: http://www.mti-mobile.com/wp-content/uploads/2012/10/radiocomp_altera_MWC_white_paper2.pdf.

The digital uplink and/or downlink radio signals are transmitted along a digital data path, the data path including, for example, the SoC of the RU. That is to say, digital signals representing radio signals are received and/or transmitted via the SoC of the RU and the first interface I1 of the test device TA. Those digital signals, which may also be denoted as one or more test vector, are generated by the first and/or second processor of the test device. For regular operation, the digital signals are forwarded from the SoC of the RU to the one or more antennas of the antenna unit. Now, for the purposes of testing proper functioning of the RU, the signals are returned to test device TA, in particular via the second interface of the test device TA. To this end, several options are available. As the SoC of the RU is assembled on a printed circuit board (PCB), the contacts pads of the PCB may be used to return the digital signals processed by the SoC to the test device TA. First, it is proposed to provide a probe with a specific interface (e.g., configured to the geometric arrangement of the contact pads on the circuit board) for coupling to the contact pads of a printed circuit board (PCB) of the RU under test, e.g., the DUT. That is, instead of capacitively coupling, e.g., AC coupling, to the one or more capacitors of the PCB, it is proposed to directly couple of the testing device via a connection cable to the contact pads, e.g., by physical contact. Thereby, capacitive coupling occurs directly from the contact pads into the connection cable. In other words, a DC coupling (contrary to AC coupling) between the contact pads and the connection cable connecting the DUT with the test device is proposed. This results in less capacitive noise due to avoiding the AC coupling filter effects. Second, it is proposed to use an optical connection link between the DUT and the test device TA in addition to the DC coupling to the contact pads of the PCB. This results in less signal distortion when compared to a regular wire-based measurement probe. Third, an optical transceiver may be brought close to the electrical connection to the PCB's contact pads, e.g. by way of a small-form-factor, SPF, transceiver module. Again, this results in less signal distortion. All of the above may be combined into a single measurement probe for connecting to the DUT. The digital signals picked up at the contact pads of the PCB of the DUT may be transmitted to the test device TA. The incoming digital signals may be received by the test device via the second interface I2.

Figure 6:
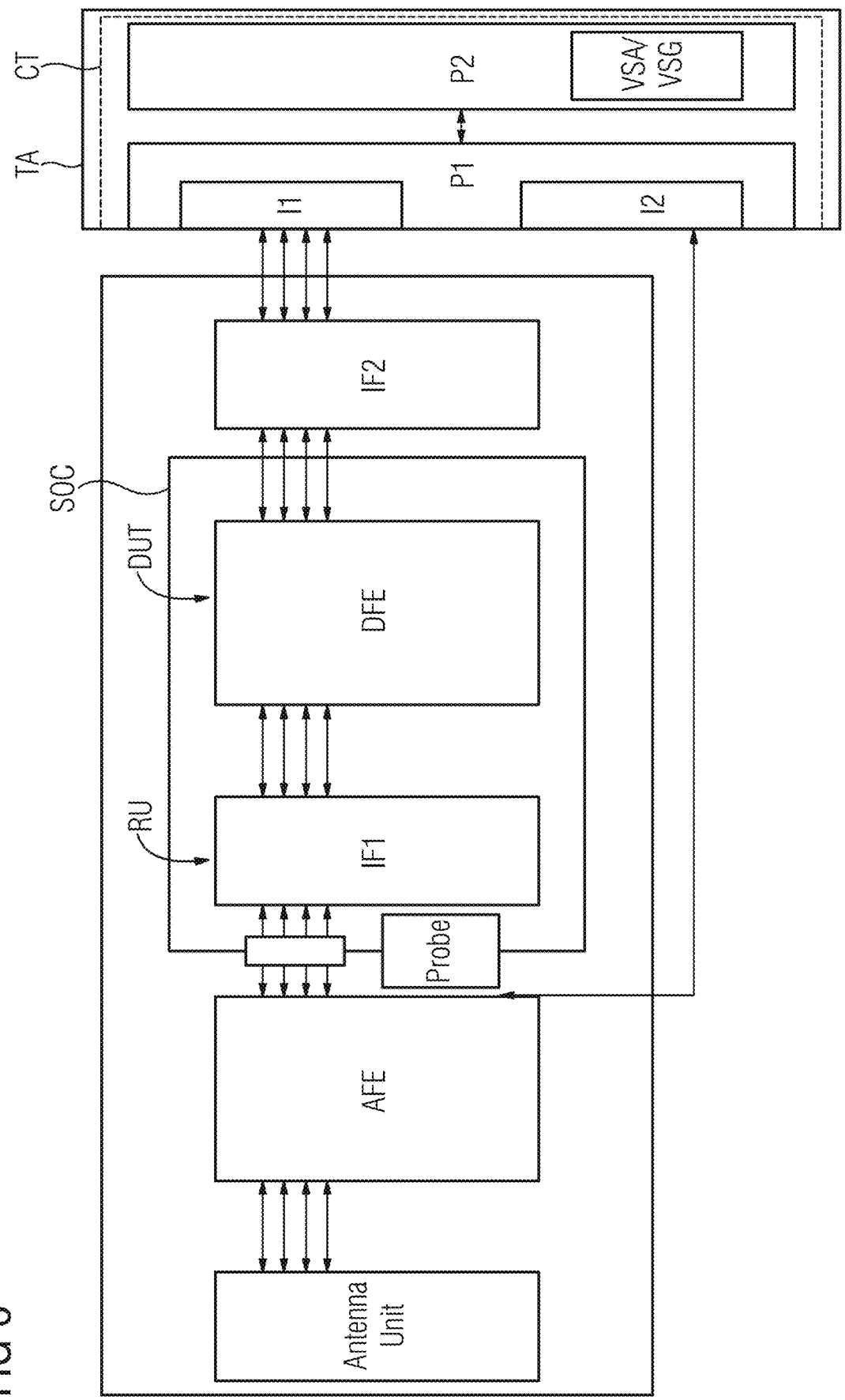
FIG. 6 depicts yet another illustration of a radio equipment test system.

As may be seen in FIG. 6, the RU under test may include an antenna unit or may be coupled to an antenna unit. The antenna unit may, as described in the above, include one or more antennas. The radio signals received via the antenna unit may be transmitted to an analog front end, AFE, from where the radio signals are further transmitted to the SoC of the RU. The SoC may include a first protocol interface IF1 for coupling to the AFE. Either the AFE or the protocol interface may include one or more analog-to-digital-converters for processing the incoming signals. Subsequently, the digital signals may be processed by a digital front end, DFE. Details of the functioning of an exemplary digital front end are described in "Digital Front End (DFE) User Guide for Keystone II Devices, User's Guide, Literature Number: SPRUHX8A July 2014—Revised April 2015", retrievable from http://www.ti.com/lit/ug/spruhx8a/spruhx8a.pdf. The DFE may output data via a second protocol interface IF2. Here, a protocol according to a functional split, such as (e)CPRI, may be used. Instead, another digital protocol, such as JESD204B may be used, to communicatively couple the RU to the test device TA via the first interface I1.

A probe, (e.g., as described in the above), may be attached between Analog and Digital Front End (AFE/DFE), e.g., via the contact pads of a PCB, in order receive or transmit test signals. Already at the interface between the AFE and the DFE, a digital protocol, such as JESD204B/C protocol, may be employed. The coupling between the contact pads and the probe may be AC-coupling or DC-coupling, although as proposed in the above DC-coupling has certain advantages.

Figure 7:
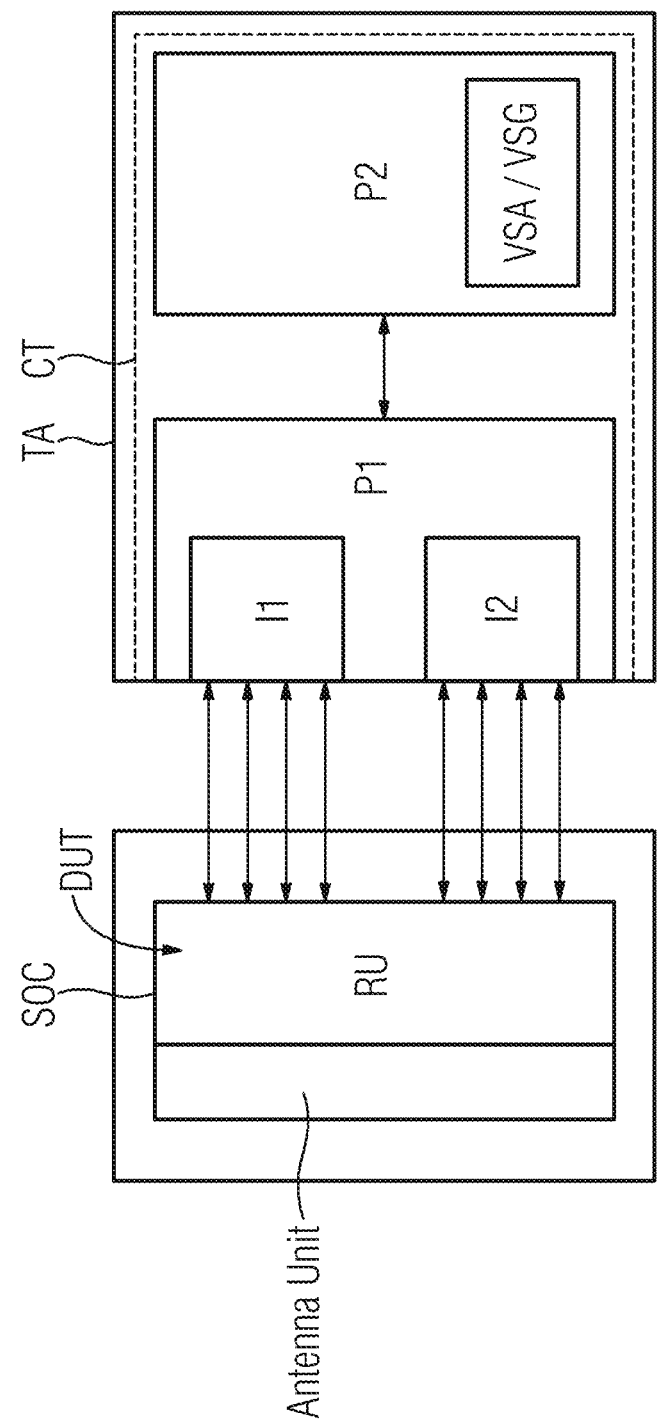
FIG. 7 depicts yet another illustration of a radio equipment test system.

In an alternative embodiment as shown in FIG. 7, a SoC internal loopback may be used for testing purposes. In that case, the SoC may be operationally connected to the first interface I1 and the second interface I2 of the test device TA. To this end, a data path within the SoC is established that allows for processing data in the forward run, e.g. from the test device TA via the SoC, and allows for the processed data to be transmitted back to the test device TA via another or the same interface IF2 of the SoC. Thereby no probe is necessary for picking up processed signals between the antenna unit and the SoC. The processed data may then be received by the test device TA via the second interface I2. For data transmission in the forward run, interface I1 of the test device TA may be used and for data transmission in the return path, interface I2 of the test device may be used.

Figure 8:
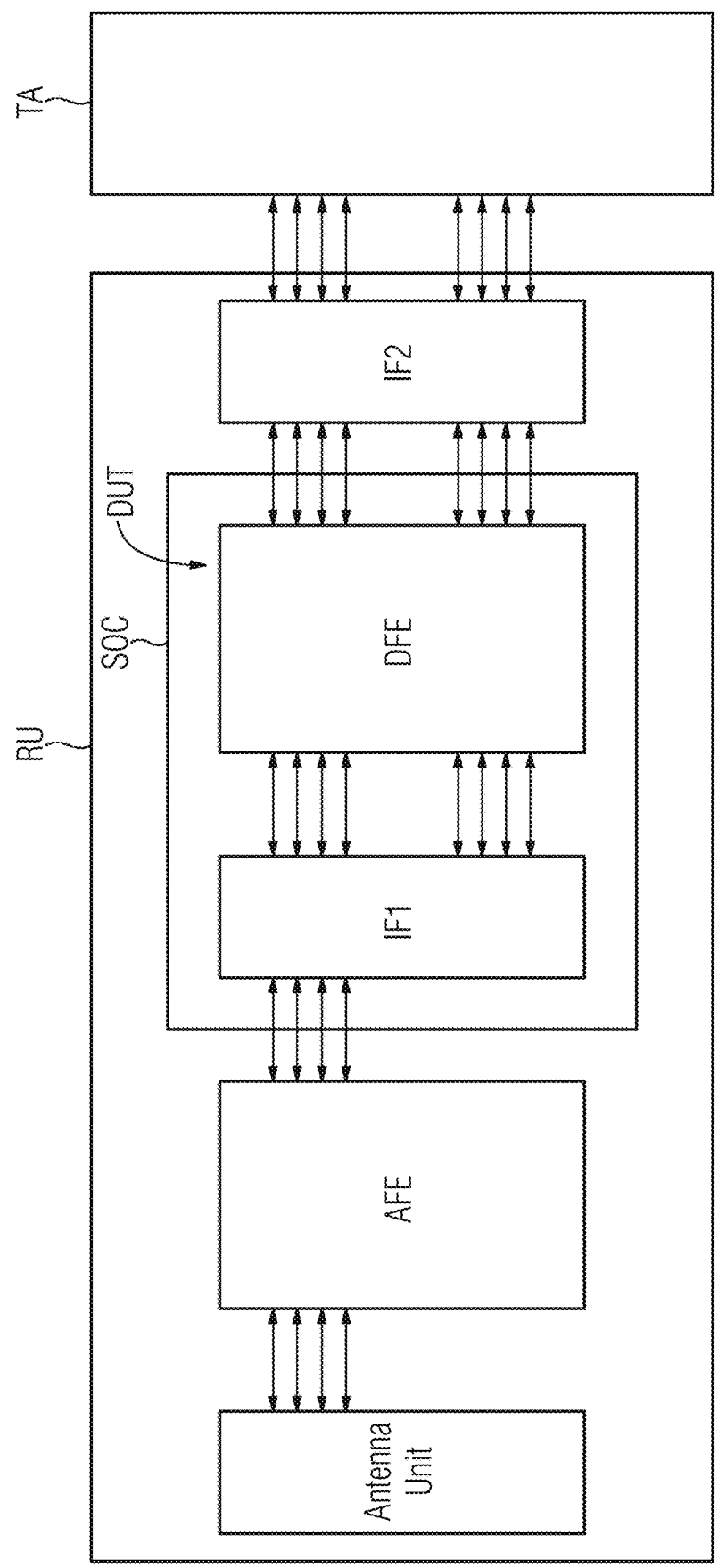
FIG. 8 depicts yet another illustration of a radio equipment test system.

FIG. 8 shows a more detailed illustration of the data path including a feedback loop within the SoC as described in connection with FIG. 7. In this scenario, as well as in FIGS. 5 and 6, the radio equipment under test, e.g., the DUT, may be the RU or more particularly the SoC or some other digital data processing components of the RU. The RU may, as described in the above, be coupled to an antenna unit or the antenna unit may be an integral part of the RU. The antenna unit may thus be arranged in the same enclosing. The feedback loop may include in the forward run the interface IF2, the DFE, and the interface IF1 (if such an interface is present). The signals arriving at the interface IF1 of the SoC may be returned via a return path via the DFE and the interface IF2 again. It should be understood that the signals may be processed in the forward run only and are looped through the DFE for the sake of transmitting the signals back to the test device. Now, instead of receiving data signals at the test device TA via the interface I2, data signals may be transmitted from the test device TA via the interface I2. These digital signals may then be processed by the SoC of the RU and transmitted via the first interface I1 to the test device TA again.

Figure 9:
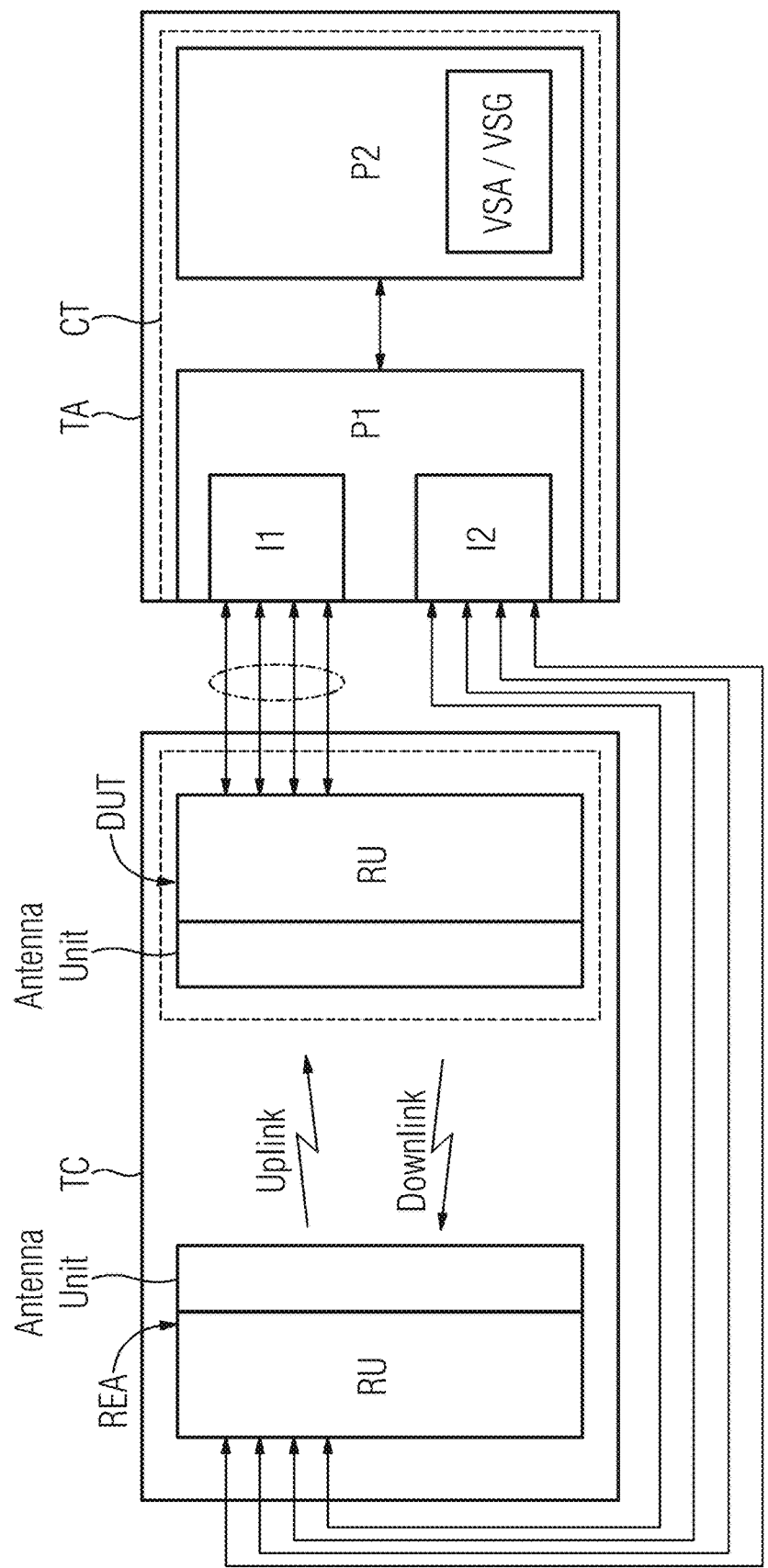
FIG. 9 depicts yet another illustration of a radio equipment test system.

In FIG. 9, yet another setup of a radio equipment test system is shown. Therein, the reference antenna REA includes a RU and antenna unit. The reference antenna REA may thus be an active antenna. Hence, in the example shown, the device under test DUT and the reference antenna REA may be identical in construction and arranged in the same test chamber. As described in the examples in the above, the DUT is connected to a first interface P1 of the first processor P1 of the test device TA, whereas the reference antenna is an active antenna and is connected to a second interface P2 of the control unit of the test device. More particular, the DUT is connected to a first interface of the first processor P1 of the control unit CT and the reference antenna is connected to a second interface of the control unit CT.

Thus, it is also possible to use a (e.g., tested) reference antenna REA as a golden unit against which all later devices are tested. A golden unit or golden device is an example of a device (such as a unit of measure) against which all later devices are tested and judged. The term "golden" is used to describe the precision of the device to standard specifications. This test method is especially useful when an analog RF path is needed to test, and there is no available suitable test equipment for the testing purpose.

Figure 10:
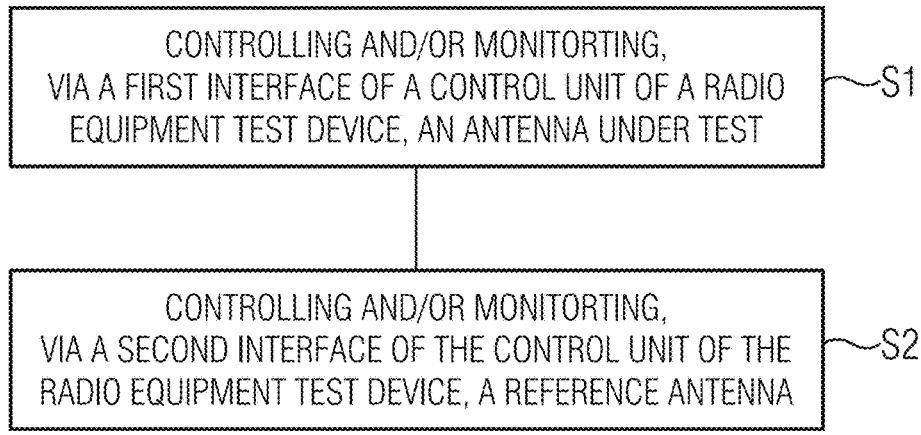
FIG. 10 depicts exemplary method acts for testing radio equipment.

Turning to FIG. 10, exemplary method acts of testing a radio equipment by way of a single radio equipment test device are shown. The method may be performed by a test setup, e.g., test system, as depicted in one of the FIGS. 1 to 9. However, other setups are possible by way of which the method acts as described in the following are executed.

In act S1, controlling and/or monitoring an antenna under test in a test chamber via a first interface of a control unit of a radio equipment test device may be performed. In act S2, controlling and/or monitoring a reference antenna via a second interface of the control unit of the radio equipment test device may be performed.

Herein, controlling may include but is not limited to receiving and/or transmitting radio signals, e.g. in the form of IQ data, by the test device. Monitoring may include but is not limited to storing and/or displaying radio signals (or digital representations thereof) received and/or transmitted, e.g. in the form of IQ data, by the test device. Monitoring may further include comparing radio signals received and/or transmitted by the test device with one or more threshold values, e.g. of constellation points of the radio signals.

By way of a single test device a central control for generating and measuring/analyzing behavior of an antenna under test is provided. Therefore, uniform test runs may be performed avoiding irregularities due to usage of different devices, e.g. by different vendors. In addition, different devices may have different characteristics when it comes to signal processing and/or due to different setting options which may not correspond.

Figure 11:
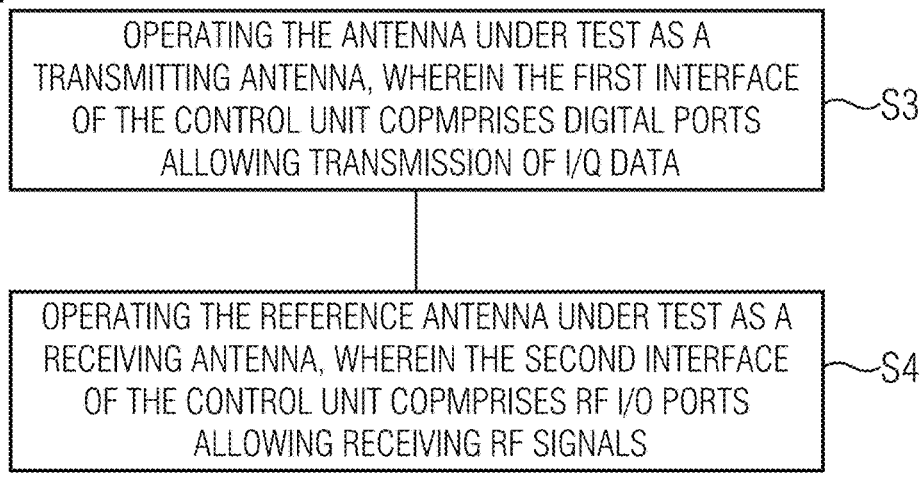
FIG. 11 depicts further exemplary method acts for testing radio equipment.

Turning to FIG. 11, further exemplary method acts of testing a radio equipment by way of a single radio equipment test device are shown. Act S3 of operating the antenna under test as a transmitting antenna may be performed, wherein the first interface of the control unit may include one or more digital ports allowing transmission of I/Q data. Furthermore, act S4 of operating the reference antenna as a receiving antenna may be performed, wherein the second interface of the control unit includes RF I/O ports allowing receiving RF signals.

The first and/or the second interface may include one or more I/O cells, also known as I/O blocks, of the first processor, (e.g., an FPGA). One or more of the I/O cells may provide an interface between internal circuits of the first processor and (sampled) radio signals of the antenna under test and/or the reference antenna. The one or more I/O cell may be programmable and may include a bi-directional buffer, logic circuitry like flipflops or multiplexers, and routing resources.

For example, there may be a first mode of operation (for testing) during which the control unit is operative to operate the antenna under test as a transmitting antenna, wherein the first interface of the control unit includes digital ports allowing transmission of I/Q data, e.g. to a RU integrated with the antenna under test and/or the test chamber, and during which the control unit is operative to operate the reference antenna as a receiving antenna, wherein the second interface of the control unit includes RF I/O ports allowing receiving RF signals, in particular RF I/O ports allowing conductive measurements, by operatively coupling to the reference antenna, e.g., by way of a cable.

The interface between the first and the second processor may be implemented by way of a bus or a switch, e.g. by Peripheral Component Interconnect Express, RapidIO, serial peripheral interface (SPI) interface or a custom bridge. This allows for optimizing performance and cost by off-loading pre- and/or post-processing of data to the first or second processor, respectively.

Furthermore, by using a single FPGA, dedicated FPGA resources may be created for co-processing data received via the first and the second interface. The single control unit or single test device also allows for reduced design for a test system for performing radio equipment testing.

The control unit, in particular the first processor, may be configured to generate digital test signals which are subsequently transmitted by the antenna under test and may be configured to receive via the reference antenna during the transmitter test mode, e.g., first mode of operation.

Figure 12:
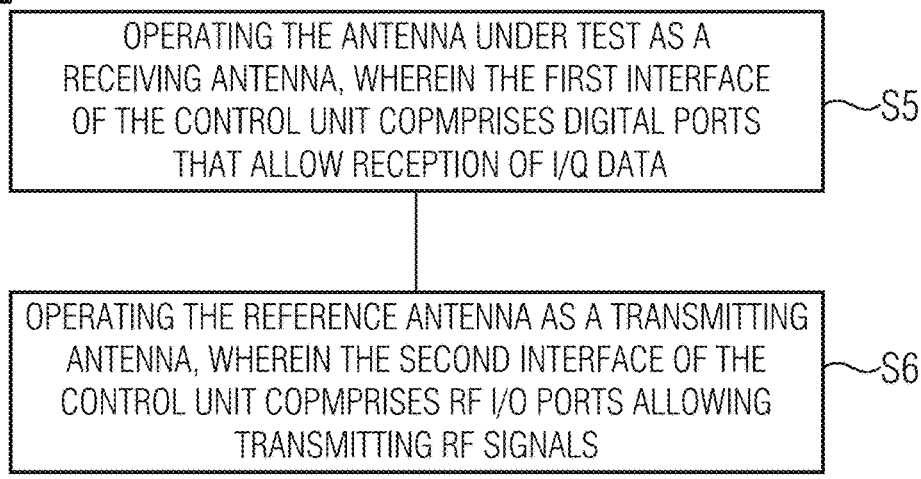
FIG. 12 depicts further exemplary method acts for testing radio equipment.

Turning to FIG. 12, further exemplary method acts of testing a radio equipment by way of a single radio equipment test device are shown. Act S5 of operating the antenna under test as a receiving antenna may be performed, wherein the first interface of the control unit includes digital ports that allow reception of I/Q data. In act S6, operating the reference antenna as a transmitting antenna may be performed, wherein the second interface of the control unit includes RF I/O ports allowing transmitting RF signals. For example, there may be an Analog-to-Digital-converter, ADC, or Digital-to-Analog-converter, DAC, necessary for converting IQ data from the FPGA into RF signals for driving the reference antenna or the other way around.

Figure 13:
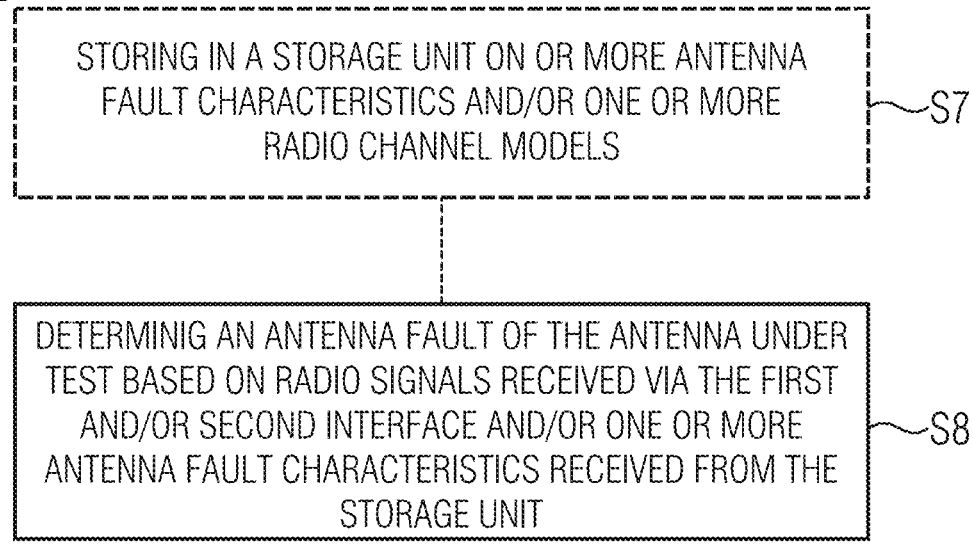
FIG. 13 depicts further exemplary method acts for testing radio equipment.
Figure 16:
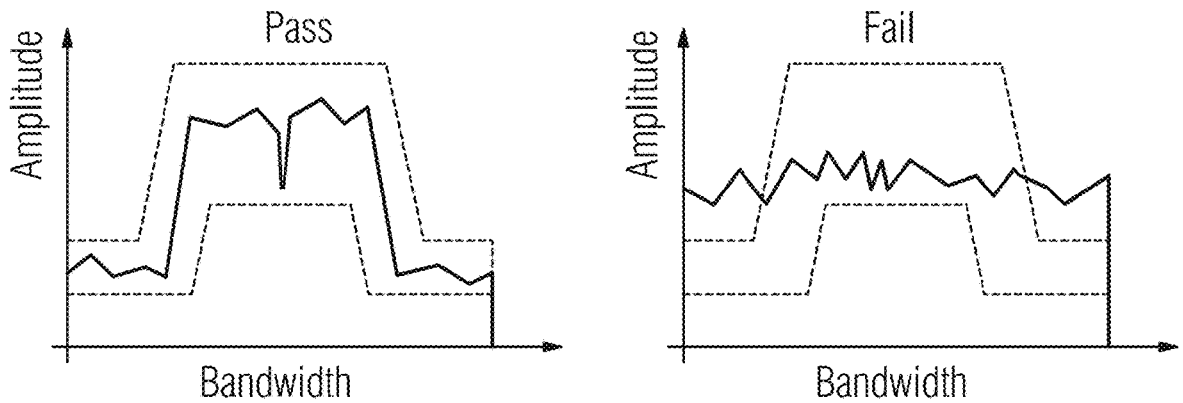
FIG. 16 depicts an illustration of antenna fault characteristics.

Turning to FIG. 13, further exemplary method acts of testing a radio equipment by way of a single radio equipment test device are described. Optionally, act S7 of storing in a storage unit one or more antenna fault characteristics and/or one or more radio channel models may be performed. The storage unit may be within the enclosure or housing of the test device or may be connected a cloud platform which includes the storage unit. Act S8 of determining an antenna fault of the antenna under test based on radio signals received via the first and/or second interface and/or one or more antenna fault characteristics received from the storage unit may be performed. For example, a recorded frequency spectrum may serve as a fault characteristic for an antenna under test. An exemplary, antenna fault characteristic is shown in FIG. 16.

In addition, there may be a second mode of operation (for testing) during which the control unit is operative to operate the antenna under test as a receiving antenna, wherein the first interface of the control unit includes digital ports that allow reception of I/Q data, e.g. from a remote radio head integrated with the antenna under test and/or the test chamber, and wherein the control unit is operative to operate the reference antenna as a transmitting antenna, wherein the second interface of the control unit includes RF I/O ports allowing transmitting RF signals, in particular RF I/O ports allowing transmission of RF test signals, by operatively coupling to the reference antenna, e.g., by way of a cable.

In certain embodiments, the control unit, in particular the first processor, is configured to send RF test signals via the one or more reference antennas to the antenna under test of the DUT during the receiver test mode, e.g., second mode of operation, to generate digital signals to be analyzed by the control unit.

The main advantage of digital signal processing within an FPGA is the ability to tailor the implementation to match system requirements. This means in a multiple-channel or high-speed system, advantage may be taken of the parallelism within the FPGA to maximize performance. Multiple channels, e.g., to and/or from the antenna under test and the reference antenna, are likely and similar processing takes place in each channel.

Memory is required for data and coefficient storage. This may be a mixture of RAM and ROM internal to the FPGA. RAM is used for the data samples and is implemented using a cyclic RAM buffer. The number of words is equal to the number of filter taps and the bit width is set by sample size. ROM is required for the coefficients.

The second processor may serve as a radio frequency (RF) signal generator and analyzer configured to send and receive RF test signals.

The first processor and the second processor may be communicatively coupled via a chip-to-chip interface. The first processor may be an FPGA and may be regarded as a coprocessor to the second processor. The control unit may include a second processor, (e.g., a CPU), communicatively coupled to the first processor.

Figure 14:
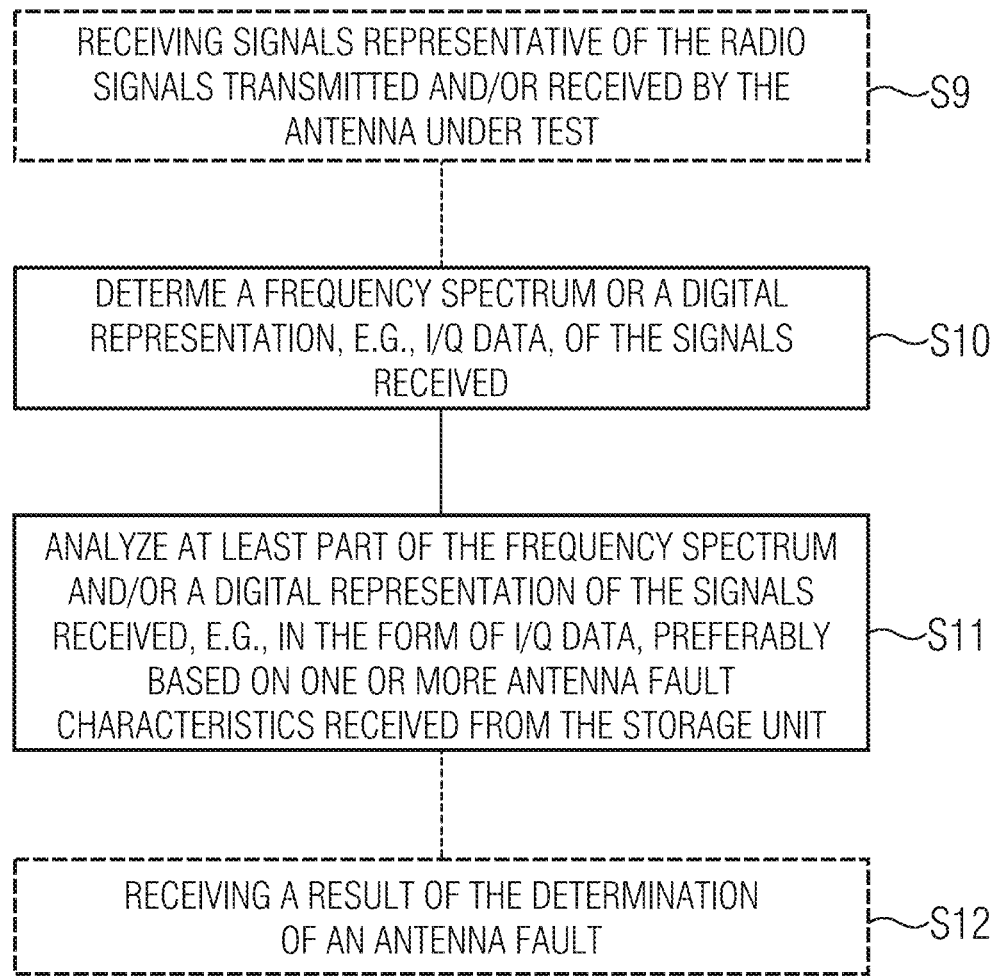
FIG. 14 depicts further exemplary method acts for testing radio equipment.
Figure 15:
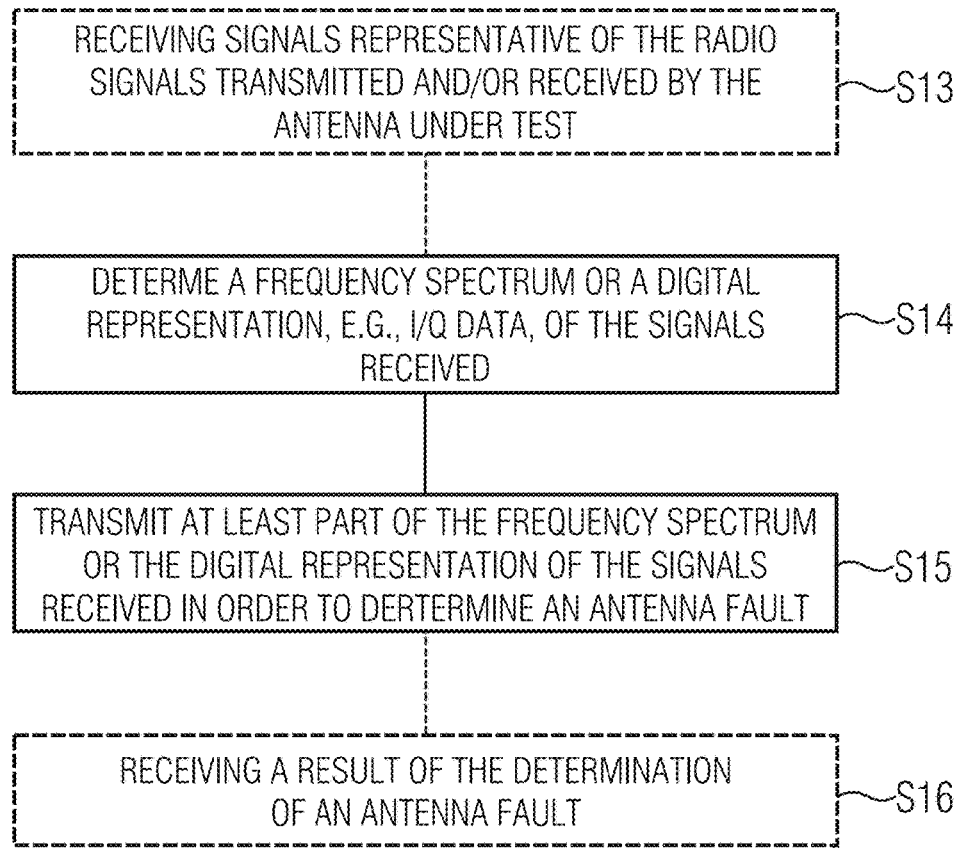
FIG. 15 depicts further exemplary method acts for testing radio equipment.

Turning to FIG. 14, further exemplary method acts of testing a radio equipment by way of a single radio equipment test device are shown. Act S9 of receiving, by the test device, signals representative of the radio signals transmitted and/or received by the antenna under test, e.g. via the first interface of the control unit of the test device, is performed. This may take place during operation of the test device. Subsequently, act S10 of determining a frequency spectrum or a digital representation, e.g., I/Q data, of the signals received is performed. The radio signals may be first sampled and converted to IQ data and processed according to one or more radio channel models. The one or more radio channel models representing radio wave propagation as a function of frequency, distance, and/or other conditions. The processing of the sampled radio signals may be performed by the first processor of the control unit of the test device. The processed radio signals may subsequently be forwarded to the second processor of the control unit of the test device. Subsequently, act S11 of analyzing at least part of the frequency spectrum and/or a digital representation of the signals received, e.g., in the form of I/Q data, (e.g., based on one or more antenna fault characteristics received from the storage unit), may be performed. For example, a recorded frequency spectrum may serve as a fault characteristic for an antenna under test and may be compared to the frequency spectrum determined based on the radio signals received. An analysis may then include comparing the two frequency spectra or at least one or more parts with each other in other to receive a result of the analysis. As a consequence, act S12 of receiving a result of the determination of an antenna fault may be performed. For example, the result may be presented to a user conducting or supervising the testing of the antenna under test. Presentation may be for example by way of an indication on a display, in particular of test device or another control device, such as a handheld. Additionally, or alternatively, the result may be stored in a memory, e.g., above mentioned storage unit.

FIG. 16 shows an exemplary power spectrum of an antenna. The power spectrum of a radio signal is shown as function of the amplitude of the signal received (y-axis), e.g. by the reference antenna, and the respective bandwidth (x-axis), e.g., frequency. As may be seen in the "Pass"-case the power spectrum lies within an upper and lower threshold. The thresholds are represented by the dashed lines as shown in FIG. 16, whereas the power spectrum is depicted as a continuous line. The one or more upper and lower thresholds may serve for identifying proper functioning of the antenna and/or for identifying an antenna fault. In the "Fail"-case, the power spectrum of the antenna under test lies outside the desired frequency response of the antenna. Hence, an antenna fault may be determined, and a corresponding indication may be outputted by the test device. The one or more thresholds may thus serve for identifying an antenna fault characteristic and thereby identify a specific antenna fault based on the radio signals received. For example, one or more thresholds may be used to determine a phase error between antenna elements of an antenna array. Other antenna faults such as amplitude errors and/or timing and/or frequency errors may be determined the same way. An antenna fault may be due to the production process, e.g., due to certain tolerances and/or due to thermal or other effects.

It will be appreciated that the foregoing description and the accompanying drawings represent non-limiting examples of the methods and apparatus taught herein. As such, the apparatus and techniques taught herein are not limited by the foregoing description and accompanying drawings.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A radio equipment test device for testing a radio unit, the radio equipment test device comprising:
a radio unit comprising a System-on-a-Chip (SoC);
a first interface; and
a second interface,
wherein an SoC internal loopback is used for testing purposes,
wherein the SoC is operationally connected to the first interface and the second interface,
wherein the first interface is configured to be used for data transmission in a forward run, and
wherein the second interface is configured to be used for data transmission in a return path.

2. The radio equipment test device of claim 1, wherein the radio unit is coupled to an antenna unit or the antenna unit is an integral part of the radio unit.

3. The radio equipment test device of claim 2, wherein the SoC internal loopback comprises, in the forward run, the first interface, a digital front end (DFE) of the SoC, and the second interface, and
wherein signals arriving at the first interface are returned via the return path via the DFE and the second interface.

4. The radio equipment test device of claim 3, wherein the signals are processed in the forward run only and are looped through the DFE for transmitting the signals back to the radio equipment test device.

5. The radio equipment test device of claim 1, wherein the SoC internal loopback comprises, in the forward run, the first interface, a digital front end (DFE) of the SoC, and the second interface, and
wherein signals arriving at the first interface are returned via the return path via the DFE and the second interface.

6. The radio equipment test device of claim 5, wherein the signals are processed in the forward run only and are looped through the DFE for transmitting the signals back to the radio equipment test device.

* * * * *